United States Patent
Yang et al.

(10) Patent No.: US 9,048,429 B2
(45) Date of Patent: Jun. 2, 2015

(54) METHOD FOR ENHANCING OPTOELECTRONIC PROPERTIES OF CONJUGATED POLYMERS

(75) Inventors: Arnold Chang-Mou Yang, Hsinchu (TW); Chien-Chung Chen, Hsinchu (TW); Po-Tsun Chen, Hsinchu (TW)

(73) Assignee: NATIONAL TSING HUA UNIVERSITY, Hsin Chu (TW)

( * ) Notice: Subject to any disclaimer, the term of this patent is extended or adjusted under 35 U.S.C. 154(b) by 271 days.

(21) Appl. No.: 13/417,776

(22) Filed: Mar. 12, 2012

(65) Prior Publication Data

US 2013/0049238 A1    Feb. 28, 2013

(30) Foreign Application Priority Data

Aug. 25, 2011   (TW) ............... 100130540 A
Dec. 5, 2011    (TW) ............... 100144720 A

(51) Int. Cl.
*B27N 3/18* (2006.01)
*H01L 51/00* (2006.01)
*B82Y 10/00* (2011.01)

(52) U.S. Cl.
CPC ......... *H01L 51/0015* (2013.01); *H01L 51/0003* (2013.01); *H01L 51/0043* (2013.01); *H01L 51/0045* (2013.01); *Y02E 10/549* (2013.01); *B82Y 10/00* (2013.01)

(58) Field of Classification Search
USPC .............. 264/319, 204, 1.34, 1.27, 1.36, 455
See application file for complete search history.

(56) References Cited

U.S. PATENT DOCUMENTS

| | | | | |
|---|---|---|---|---|
| 5,772,905 | A | * | 6/1998 | Chou .............................. 216/44 |
| 2001/0033901 | A1 | * | 10/2001 | Affinito ........................ 427/569 |
| 2007/0152370 | A1 | * | 7/2007 | Roberts et al. ................ 264/255 |

OTHER PUBLICATIONS

Authors: Kuang-Po Tung, Chein-Chung Chen, Peiwei Lee, Yi-Wei Liu, Tzay-Ming Hong, Kuo Chu Hwang, Jui Hung Hsu, Jonathan David White and Arnold Chang-Mou Yang Title: Large Enhancements in Optoelectronic Efficiencies of Nano-plastically Stressed Conjugated Polymer Strands A journal published on Aug. 7, 2011 in the web of ACS Nano, 2011, 5(9), pp. 7296-7302 DOI: 10.1021/nn202117e.

* cited by examiner

*Primary Examiner* — Stella Yi
(74) *Attorney, Agent, or Firm* — Chih Feng Yeh; Huntington IP Counseling Co., Ltd.

(57) ABSTRACT

The present invention provides a method for enhancing optoelectronic properties of polymers that contain conjugated moieties in their molecular structures (hereby denoted as "conjugated polymers"), to be used in lighting, photovoltaics, other various optoelectronic devices and applications. The method of the present invention includes preparing a conjugated polymer layer or multiple conjugated polymer layers and imprinting the conjugated polymer layer or layers through the application of a mold or multiple molds.

10 Claims, 12 Drawing Sheets ical structures in their
molecular structures (hereby denoted as conjugated poly-

METHOD FOR ENHANCING OPTOELECTRONIC PROPERTIES OF CONJUGATED POLYMERS

FIELD OF THE INVENTION

The present invention relates to polymers that contain conjugated structures (hereby denoted as conjugated polymers), and more particularly to a method for enhancing optoelectronic properties of conjugated polymers.

BACKGROUND OF THE INVENTION

Polymers that contain conjugated structures in their molecular structures (hereby denoted as conjugated polymers) have enthused considerable interests owing to their unique optoelectronic properties, low cost, and ease of processing that promise an important role in future lighting, photovoltaics, and microelectronics. With the π-orbitals extending along the backbone in the conjugated polymers, they harvest photons to generate electron-hole pairs (also denoted as excitons in some cases) that are known to interact strongly with the vibrations of polymer chains (electron-phonon interactions) to result self-trapping and retarded charge recombination. The driving force of the electron-phonon interactions may be linked to the elevated local Coulomb energies introduced amid the excited states and the surrounding backgrounds. In abating the energy increase, the excited states, extending across several monomer units, may interact with chain vibrations to accumulate local molecular deformations. The local molecular deformations introduced because of the excited states will trap and immobilize the excited states and form the so-called self-trapping effect, such that the excited states cannot perform phase-coherent in-chain migration and only can implement hopping movement or release energy through non-radiative pathways at the self-trapping point to return the original low-energy state from the excited states. Generally, the non-radiative pathways may dissipate up to well above 90% of the total absorbed energy. Low quantum yields have long been the major hurdle for the industries to develop and mass produce viable polymer devices.

Accordingly, there is still a need for a solution to solve the aforementioned problems.

SUMMARY OF THE INVENTION

To solve the aforementioned problems of the traditional conjugated polymers, the present invention provides a method for enhancing optoelectronic properties of conjugated polymers.

In one aspect, the present invention provides a method for enhancing optoelectronic properties of conjugated polymers. The method includes preparing at least one conjugated polymer layer; and imprinting the at least one conjugated polymer layer through one or more molds.

One advantage of the present invention is that the present invention can increase the photo-luminescent intensity of the conjugated polymer up to more than twice the original intensity.

Another advantage of the present invention is that the present invention can enhance the photo-luminescent intensity of the conjugated polymer but the light colors thereof do not necessarily vary.

These and other advantages will become apparent from the following description of preferred embodiments taken together with the accompanying drawings and the appended claims.

BRIEF DESCRIPTION OF THE DRAWINGS

The present invention may be understood by some preferred embodiments and detailed descriptions in the specification and the attached drawings below. The identical reference numbers in the drawings refer to the same components in the present invention. However, it should be appreciated that all the preferred embodiments of the invention are provided only for illustrating but not for limiting the scope of the Claims and wherein:

DETAILED DESCRIPTION OF THE PREFERRED EMBODIMENT

Figure 1A:
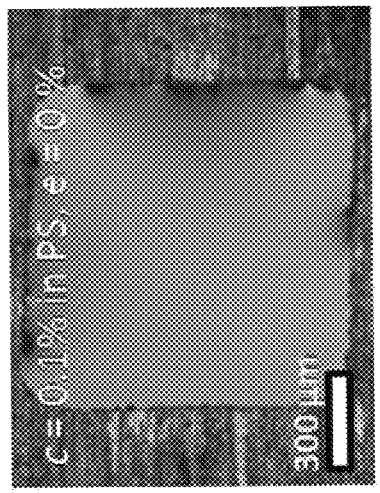
FIGS. 1a and 1d illustrates an optical microscope (OM) image of a conjugated polymer thin film before stretching and a transmission electron microscope (TEM) image of the LDZs thereof in accordance with one embodiment of the present invention.

The invention will now be described with the preferred embodiments and aspects and these descriptions interpret structure and procedures of the invention only for illustrating but not for limiting the Claims of the invention. Therefore, except the preferred embodiments in the specification, the present invention may also be widely used in other embodiments.

The present invention discloses a method for enhancing optoelectronic properties of conjugated polymers. In this description, "conjugated polymers" may include any polymers that contain conjugated structures in their molecular structures, and are not totally composed of conjugated structures. The present invention renders the conjugated polymers to generate mechanical deformations, so as to enhance the optoelectronic properties of the conjugated polymers. In one embodiment of the present invention, the conjugated polymers may include but be not limited to poly[2-methoxy-5-((2'-ethyl-hexyl)oxy)-1,4-phenylene-vinylene] (MEH-PPV). In one embodiment, the conjugated polymers may be co-dissolved with an optically inert polymer, for example polystyrene (PS), in a solvent, such as toluene, and a polymer blends thin film of MEH-PPV and PS may be further formed from the solution by utilizing for instance a spin coating method. The aforementioned embodiment is described only for illustrating the present invention but not for limiting the present invention. Therefore, in another embodiment, at least one type of pure conjugated polymer may also be employed to form the conjugated polymer thin film by directly utilizing an evaporation plating method or a plasma method or by dissolving the at least one type of pure conjugated polymer in the solvent and performing the spin coating method to the solution. In still another embodiment, at least one type of pure conjugated polymer may be utilized to mix with other one or more types of substances, which may include but be not limited to various kinds of small molecules, polymers, carbon spheres, carbon tubes or metal particles or the combination thereof, and the mixture may be dissolved in the solvent and be performed with the spin coating method to form the conjugated polymer thin film, or may be directly performed with the evaporation plating method or the plasma method without dissolution into the solvent to form the conjugated polymer thin film. After the conjugated polymer thin film is formed, the conjugated polymer thin film may be implemented with an imprinting procedure, which may include but be not limited to a nano-imprinting procedure, to effectively enhance the optoelectronic properties of the conjugated polymers.

It is discovered that if the conjugated polymers generate mechanical deformations, for example are stretched uni-axially or multi-axially, the local chain motions in the conjugated polymers, such as rotations, can be hindered and the Franck-Condon type interactions would be restricted, such that drastic enhancements of the optoelectronic properties of the conjugated polymers may emerge. The enhancements of the optoelectronic properties of the conjugated polymers may include the increases of the photo-luminescent (PL) intensity of the conjugated polymers. The mechanical deformations of the conjugated polymers can render the molecular strain of the conjugated polymers to rise. The photo-luminescent intensity of the conjugated polymers increases with the molecular strain of the conjugated polymers. While the photo-luminescent intensity enhances, the light color of the photo-luminescence will not necessarily vary because the spectral shape of the photo-luminescence doesn't change.

Figure 1B:
FIGS. 1b and 1c illustrate optical microscope (OM) images of the axially-stretched conjugated polymer thin film in accordance with one embodiment of the present invention.
Figure 1C:
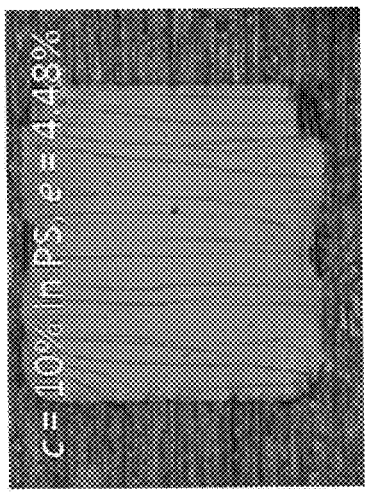
Figure 1D:
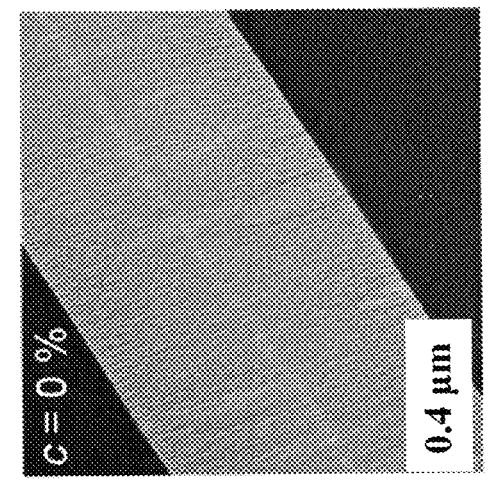
Figure 1E:
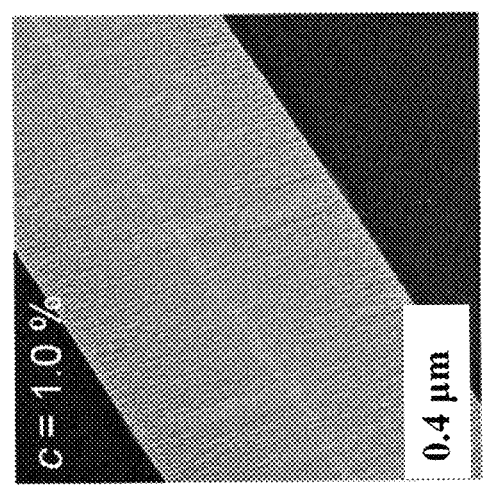
FIGS. 1e and 1f illustrate TEM images of the LDZs of the axially-stretched conjugated polymer thin film in accordance with one embodiment of the present invention.
Figure 1F:
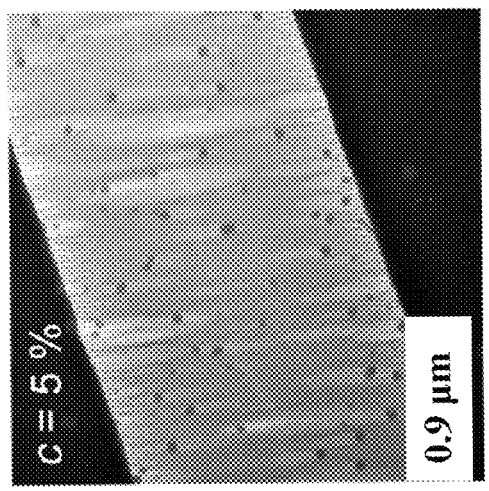

FIG. 1a is an optical microscope (OM) image of a conjugated polymer thin film before stretching, where e is the total applied strain and c is the weight fractions of the conjugated polymers (such as MEH-PPV) in the thin film formed with PS. FIGS. 1b and 1c are optical microscope (OM) images of the axially-stretched conjugated polymer thin film, where the local deformation zones (LDZs) grows along the perpendicular direction. FIGS. 1d to 1f are transmission electron microscope (TEM) images of the LDZs of the axially-stretched conjugated polymer thin film. FIGS. 2a to 2f are PL spectrum images of the axially-stretched conjugated polymer thin film, where every spectrum curve differs in intensity when different total applied strains (e) or different weight fractions of the conjugated polymers are utilized, but the spectral shape substantially doesn't change. The light color of the photo-luminescence does not necessarily vary because of the unchanged spectral shape.

In the MEH-PPV/PS blends thin film, if the concentration (c) of MEH-PPV is 1% or below, the applied deformation will cause the local plastic deformation (deformation amount is about 300%) of PS polymer chains and lead molecular chains of MEH-PPV to move together, so as to form the LDZs with severely deformed MEH-PPV. However, when the concentration of MEH-PPV is 5% or above, MEH-PPV will be precipitated as particles or aggregates in the thin film because of the limited dissolubility of MEH-PPV in PS and render the movement mode that the deformation of PS leads the deformation of MEH-PPV unable to be implemented. Thus, the MEH-PPV polymers in the LDZs of the thin film will not be apparently deformed.

Figure 2A:
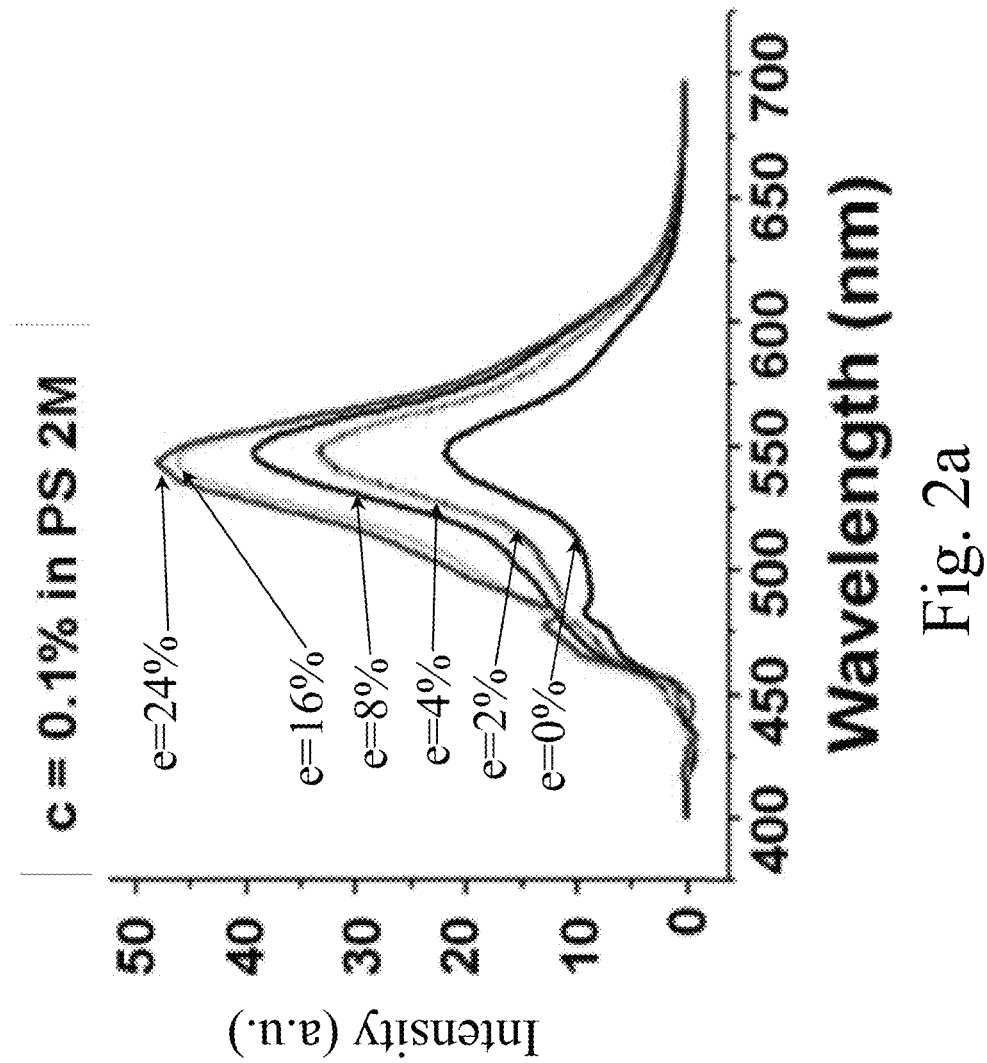
FIGS. 2a to 2f illustrate photo-luminescence (PL) spectrum images of the axially-stretched conjugated polymer thin film in accordance with one embodiment of the present invention.
Figure 2B:
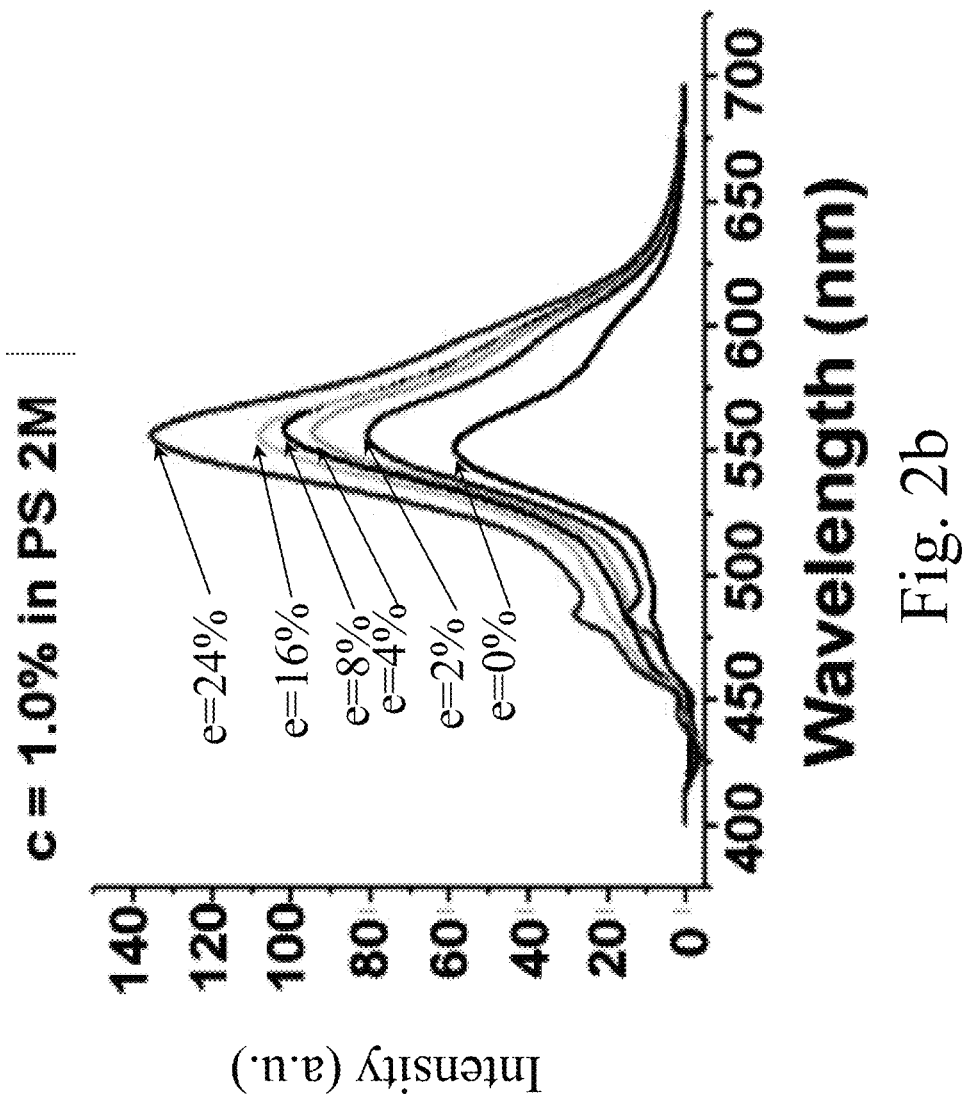

As shown in FIGS. 2a and 2b, in the samples with the low concentration of MEH-PPV, for example the weight fraction of the conjugated polymers being 0.1 wt % or 1.0 wt %, if the total applied strain (e) is larger, the PL intensity of the axially-stretched conjugated polymer thin film will be larger. As shown in FIG. 2a (c=0.1 wt %), the PL intensity where the total applied strain (e) is 24% is about twice as large as the one where the total applied strain (e) is 0%. As shown in FIG. 2b (c=1.0 wt %), the PL intensity where the total applied strain (e) is 24% is about 2.45 times as large as the one where the total applied strain (e) is 0%. If the weight fraction of the conjugated polymer increases and the total applied strain (e) remains the same, the photo-luminescent intensity of the axially-stretched conjugated polymer thin film will increase, but this is only adapted to the condition in which the weight fraction of the conjugated polymer is 1.0 (wt %) or below. The variation of the measured luminescent intensity in the spectrum is equivalent to about ten times increase of the luminescent efficiency through the conversions of the strain amount and the quantity of the stretched MEH-PPV molecules.

Figure 2C:
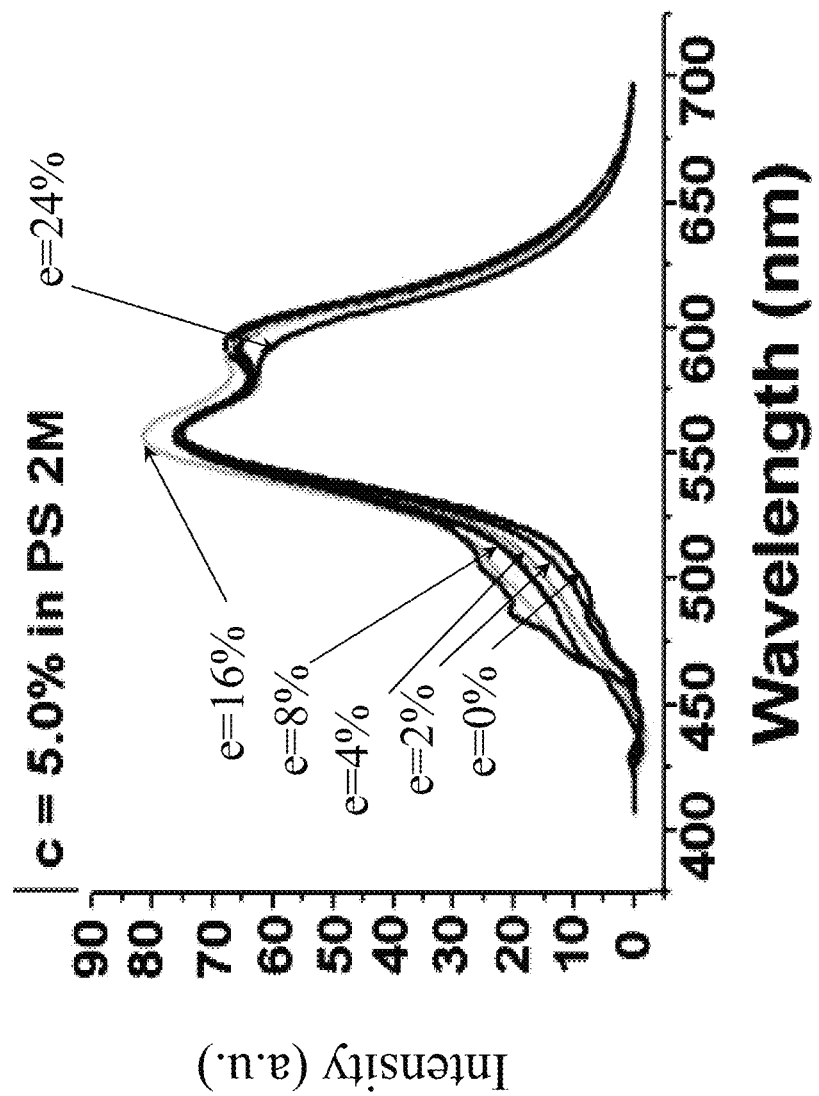
Figure 2D:
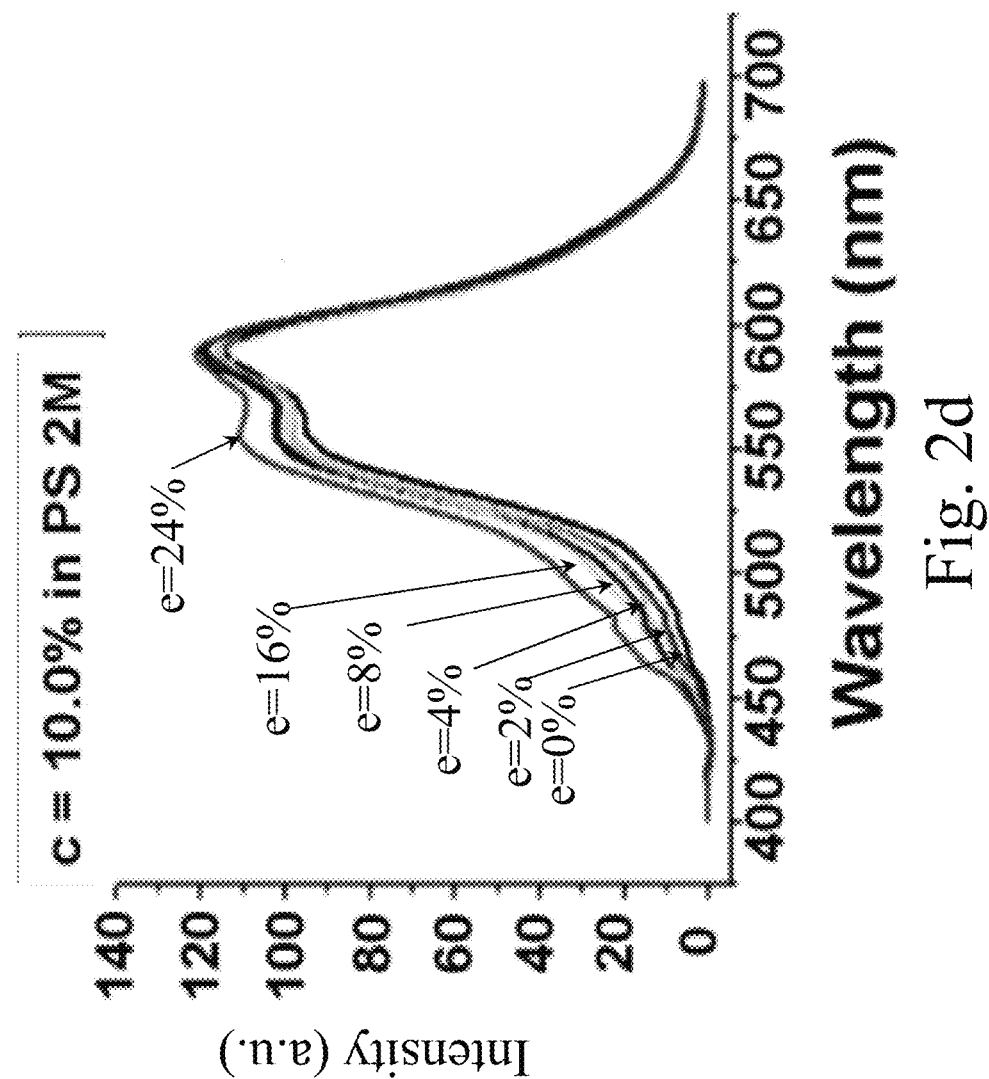
Figure 2E:
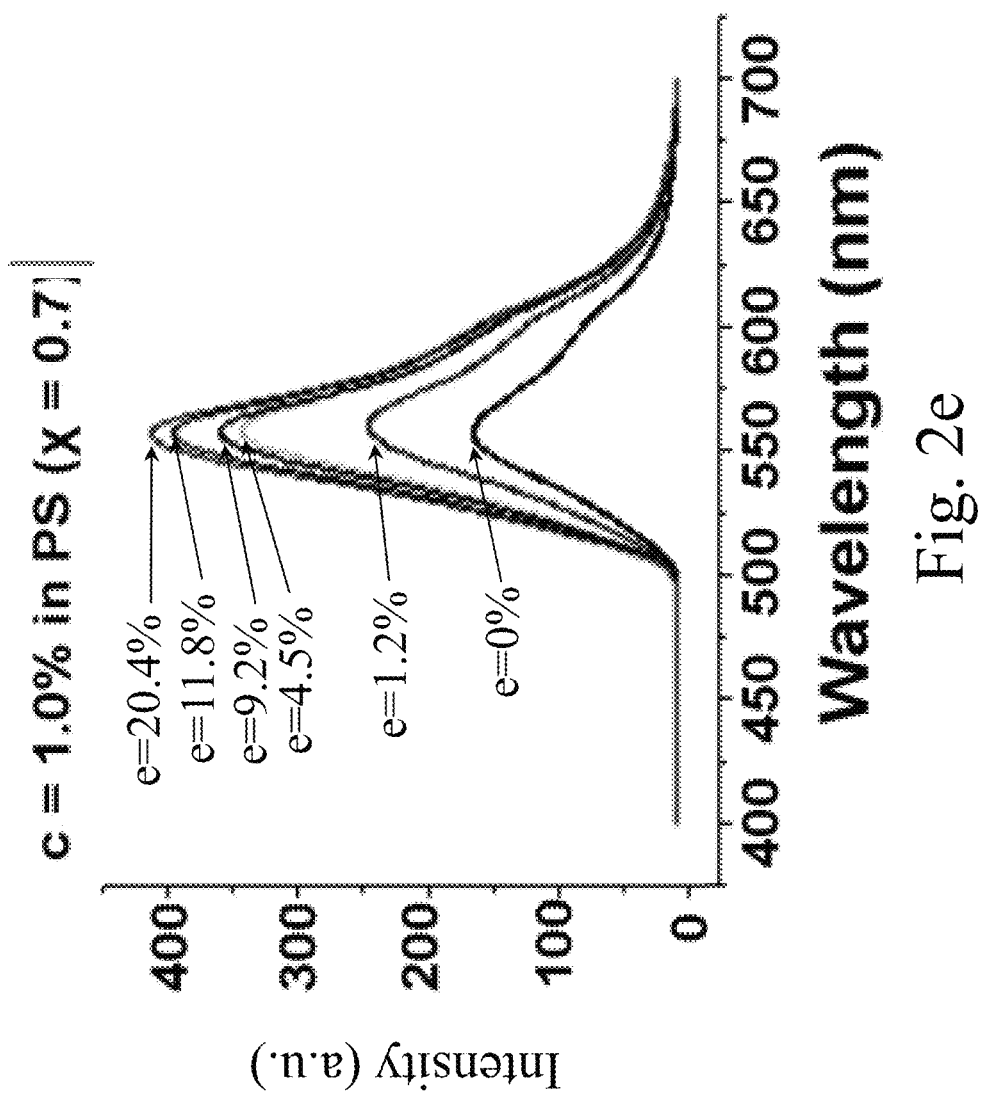

Furthermore, as shown in FIG. 2e, if a glassy blends of high molecular weight and low molecular weight PS (high molecular weight is about 2,000,000 g/mol and low molecular weight is about 2,000 g/mol and the mixing ratio thereof is about 7:3) is utilized to mix with the conjugated polymers, the PL intensity of the axially-stretched conjugated polymer thin film will significantly enhance. This is because the entanglement density of the polymer is decreased in this sample, resulting in that the strain in the LDZs increases up to 550% and the luminescent efficiency upgrades to more than 20 times the original luminescent efficiency corresponding to the increased strain.

In contrast, as shown in FIGS. 2c and 2d, if the weight fraction of the conjugated polymer is 5.0 (wt %) or above, for example 5.0 (wt %) and 10.0 (wt %), the PL intensity thereof will not increase apparently.

Figure 2F:
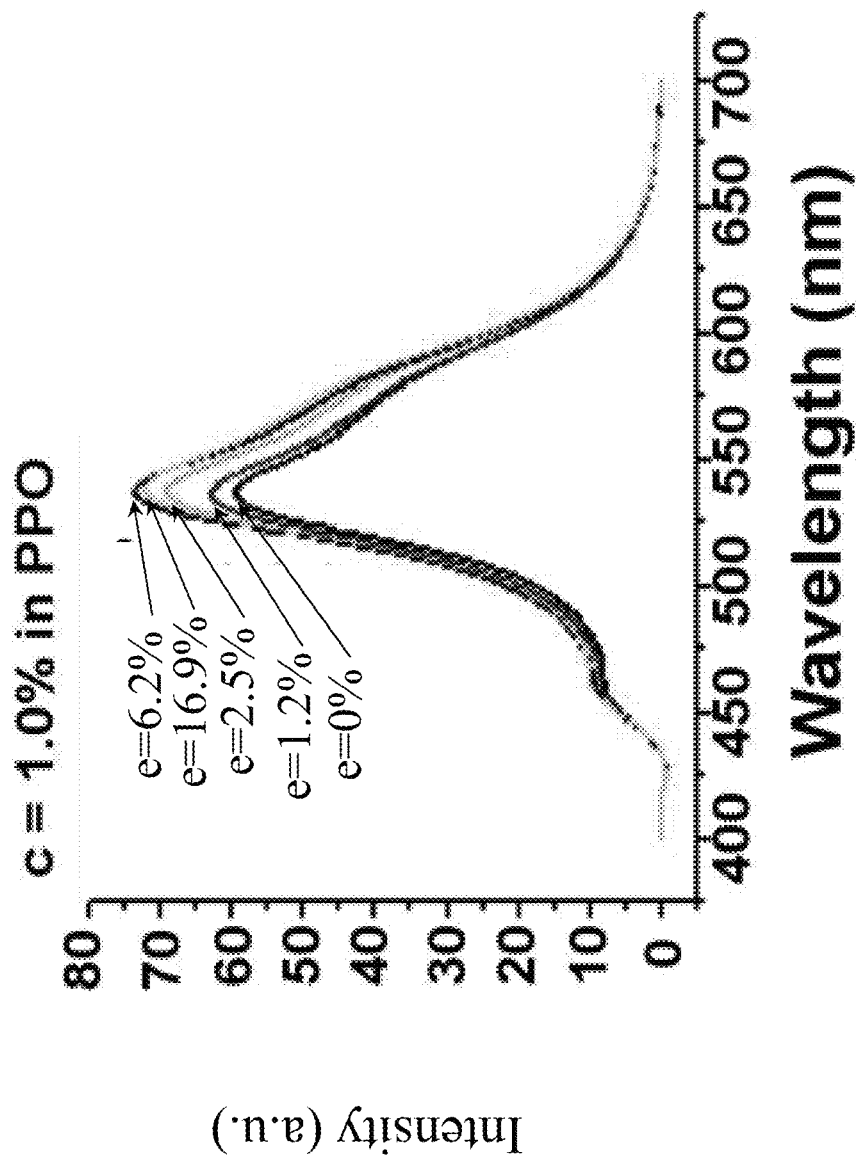

Moreover, as shown in FIG. 2f, if poly(2,6-dimethyl-1,4-diphenylene oxide) (PPO) is employed to mix with the conjugated polymers, the strain in the LDZs of the axially-stretched conjugated polymer thin film downgrades to 60%, such that the PL intensity thereof will enhance rarely.

In one preferred embodiment of the present invention, the present invention performs the imprinting procedure, which may include but be not limited to the nano-imprinting procedure, to the conjugated polymers to generate mechanical deformations, so as to enhance the optoelectronic properties of the conjugated polymers. This method may be adapted to the conjugated polymer thin films of various kinds of concentrations. The imprinted, such as nano-imprinted, conjugated polymers will flow towards multiple axial directions because of the extrusion by the mold, for example nano mold, so as to produce the effect of multi-axially stretching and further enhance the optoelectronic properties of the conjugated polymers.

Figure 3:
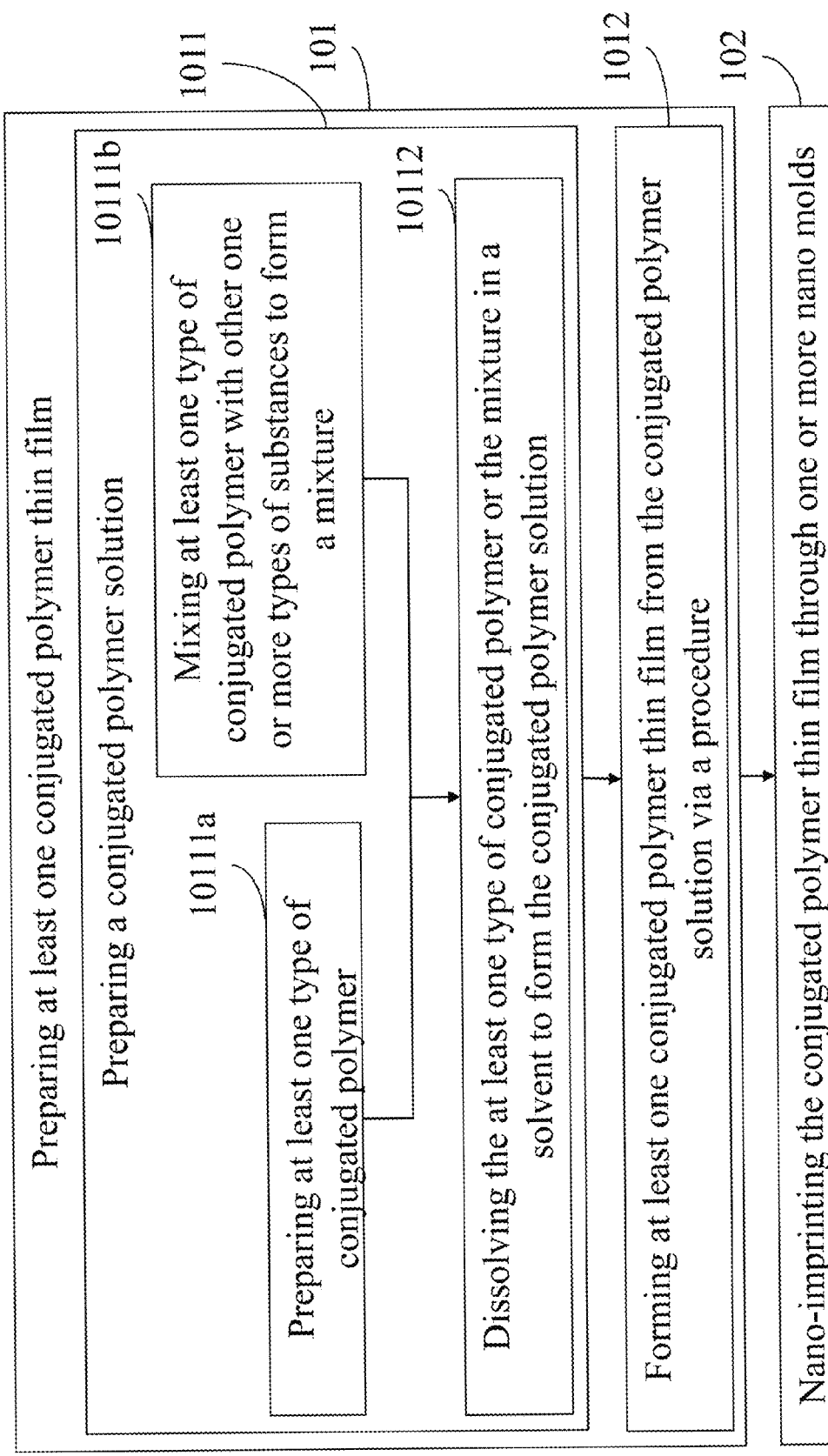
FIG. 3 illustrates a flow diagram of the method for enhancing optoelectronic properties of conjugated polymers in accordance with one preferred embodiment of the present invention.

As shown in FIG. 3, at least one conjugated polymer thin film is prepared initially in step 101. In one embodiment, the step 101 may include step 1011 and step 1012. A conjugated polymer solution is prepared in step 1011. In one embodiment of the present invention, the step 1011 may include step 10111a or step 10111b, and step 10112. In one embodiment, at least one type of conjugated polymer is prepared in step 10111a. Alternatively, in an alternative embodiment, at least one type of conjugated polymer is mixed with other one or more types of substances to form a mixture in step 10111b. The aforementioned other substances may include but be not limited to various kinds of small molecules, polymers, carbon spheres, carbon tubes, or metal particles or the combination thereof. In a preferred embodiment, a 1 wt % to 99 wt %, preferably 15 wt % to 35 wt %, more preferably 25 wt %, at least one type of conjugated polymer is mixed with a 99 wt % to 1 wt %, preferably 85 wt % to 65 wt %, more preferably 75 wt %, optically inert polymer to form a mixture, so as to disperse the conjugated polymer in the optically inert polymer. The conjugated polymer may include but be not limited to poly[2-methoxy-5-((2'-ethyl-hexyl)oxy)-1,4-phenylene-vinylene] (MEH-PPV), and the optically inert polymer may include but be not limited to polystyrene (PS). Subsequently, the at least one type of conjugated polymer or the mixture is dissolved in a solvent to form the conjugated polymer solution in step 10112. The solvent may include but be not limited to toluene solvent or a solvent of equal-parted toluene, tetrahydrofuran and cyclohexanone.

Then, at least one conjugated polymer thin film is formed from the conjugated polymer solution via a procedure, which may include but be not limited to a spin coating procedure or a hot pressing procedure, in step 1012. In one embodiment, the thickness of the conjugated polymer thin film may be about 2 nm to 2 mm, preferably about 700 nm to 800 nm, more preferably 750 nm. Subsequently, the conjugated polymer thin film is nano-imprinted through one or more nano molds by utilizing, for example a nano imprinter, which may include but not be limited to a full-wafer universal nano imprinter in step 102.

Figure 4:
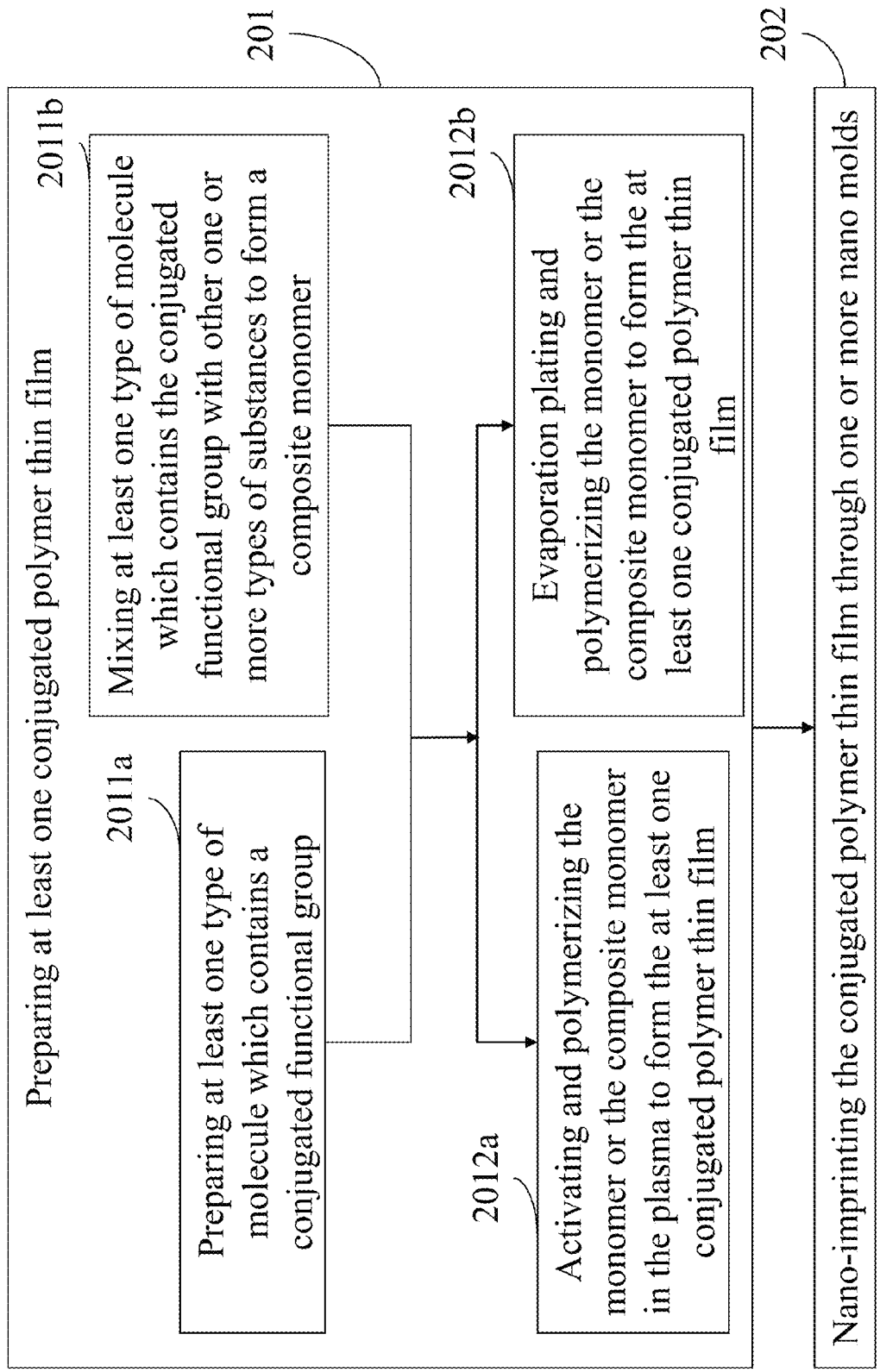
FIG. 4 illustrates a flow diagram of the method for enhancing optoelectronic properties of conjugated polymers in accordance with another preferred embodiment of the present invention.

In another embodiment of the present invention, as shown in FIG. 4, at least one conjugated polymer thin film is prepared initially in step 201. In one embodiment, the step 201 may include step 2011a or 2011b, and step 2012a or step 2012b. As shown in FIG. 4, in one embodiment, at least one type of molecule which contains a conjugated functional group is prepared as a monomer in step 2011a. Alternatively, in an alternative embodiment, at least one type of molecule which contains the conjugated functional group is mixed with other one or more types of substances to form a composite monomer in step 2011b. The aforementioned other substances may include but be not limited to various kinds of small molecules, polymers, carbon spheres, carbon tubes, or metal particles or the combination thereof. Then, in one embodiment, the monomer or the composite monomer is activated and polymerized in the plasma to form the at least one conjugated polymer thin film in step 2012a. Alternatively, in an alternative embodiment, the monomer or the composite monomer is evaporation plated and polymerized to form the at least one conjugated polymer thin film in step 2012b. In one embodiment, the thickness of the conjugated polymer thin film may be about 2 nm to 2 mm, preferably about 700 nm to 800 nm, more preferably 750 nm. Subsequently, the conjugated polymer thin film is nano-imprinted through one or more nano molds by utilizing, for example a nano imprinter, which may include but be not limited to a full-wafer universal nano imprinter in step 202.

Figure 5:
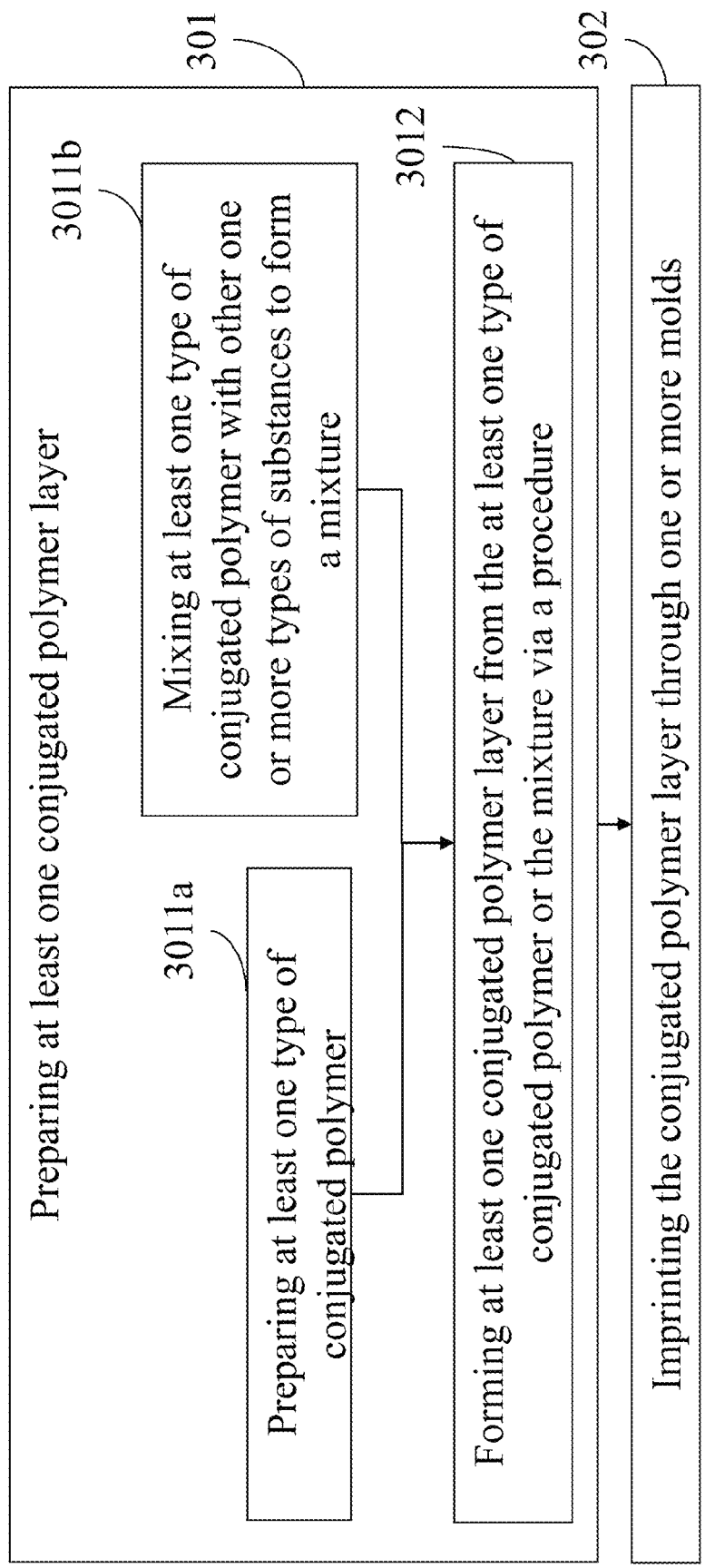
FIG. 5 illustrates a flow diagram of the method for enhancing optoelectronic properties of conjugated polymers in accordance with still another preferred embodiment of the present invention.

In still another embodiment of the present invention, as shown in FIG. 5, at least one conjugated polymer layer is prepared initially in step 301. In one embodiment, the step 301 may include step 3011a or step 3011b, and step 3012. In one embodiment, at least one type of conjugated polymer is prepared in step 3011a. Alternatively, in an alternative embodiment, at least one type of conjugated polymer is mixed with other one or more types of substances to form a mixture in step 3011b. The aforementioned other substances may include but be not limited to various kinds of small molecules, polymers, carbon spheres, carbon tubes, or metal particles or the combination thereof. Then, at least one conjugated polymer layer is formed from the at least one type of conjugated polymer or the mixture via a procedure, which may include but be not limited to a spin coating procedure or a hot pressing procedure, in step 3012. Subsequently, the conjugated polymer layer is imprinted through one or more molds by utilizing, for example, an imprinter in step 302.

Figures 6, 7:
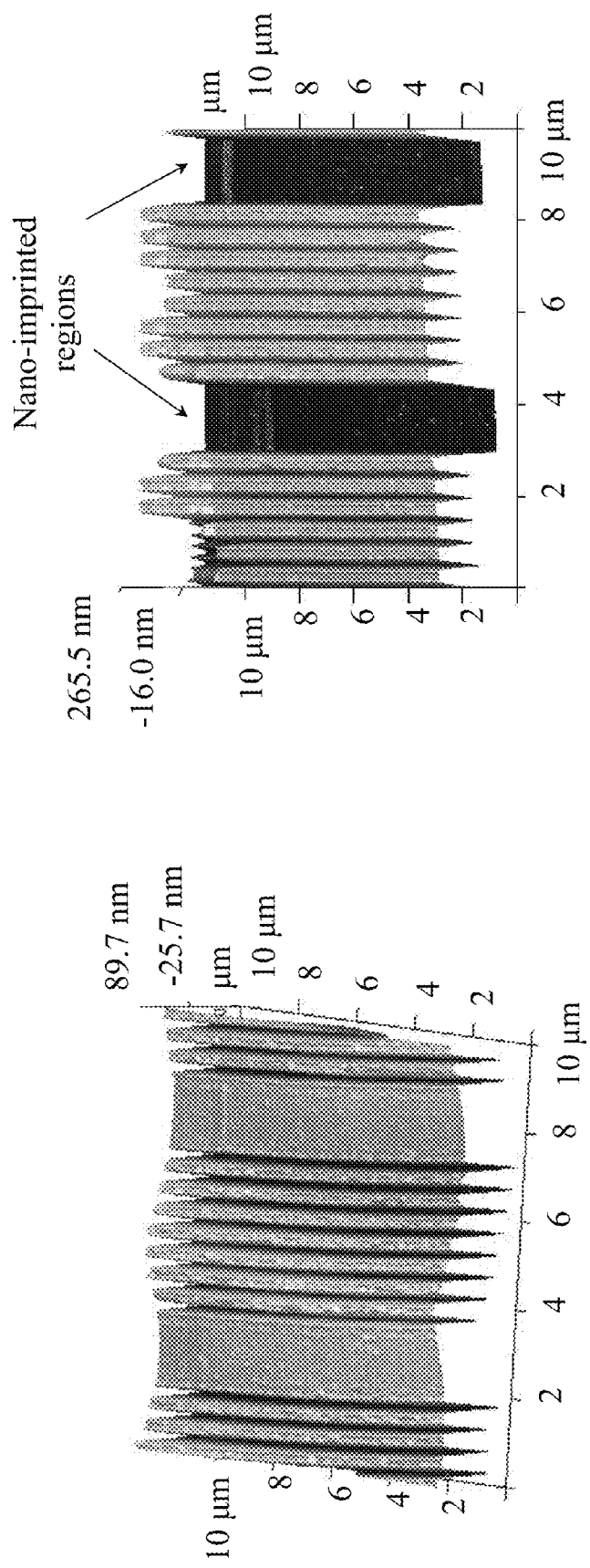
FIG. 6 illustrates a surface shape image of the nano mold observed by utilizing an atomic force microscope (AFM) in accordance with one embodiment of the present invention.
FIG. 7 illustrates an atomic force microscope image of the nano-imprinted conjugated polymer thin film in accordance with one embodiment of the present invention.

In one embodiment, the present invention may utilize the nano mold shown in FIG. 6 to perform the nano-imprinting procedure. FIG. 6 is a surface shape image of the nano mold observed by utilizing an atomic force microscope (AFM). In another embodiment, a common mold may also be employed to perform the imprinting procedure. In one preferred embodiment of the present invention, steps 102, 202 and 302 may be performed at temperature of about 140 and at pressure of about 400 psi for about three minutes.

Figure 8:
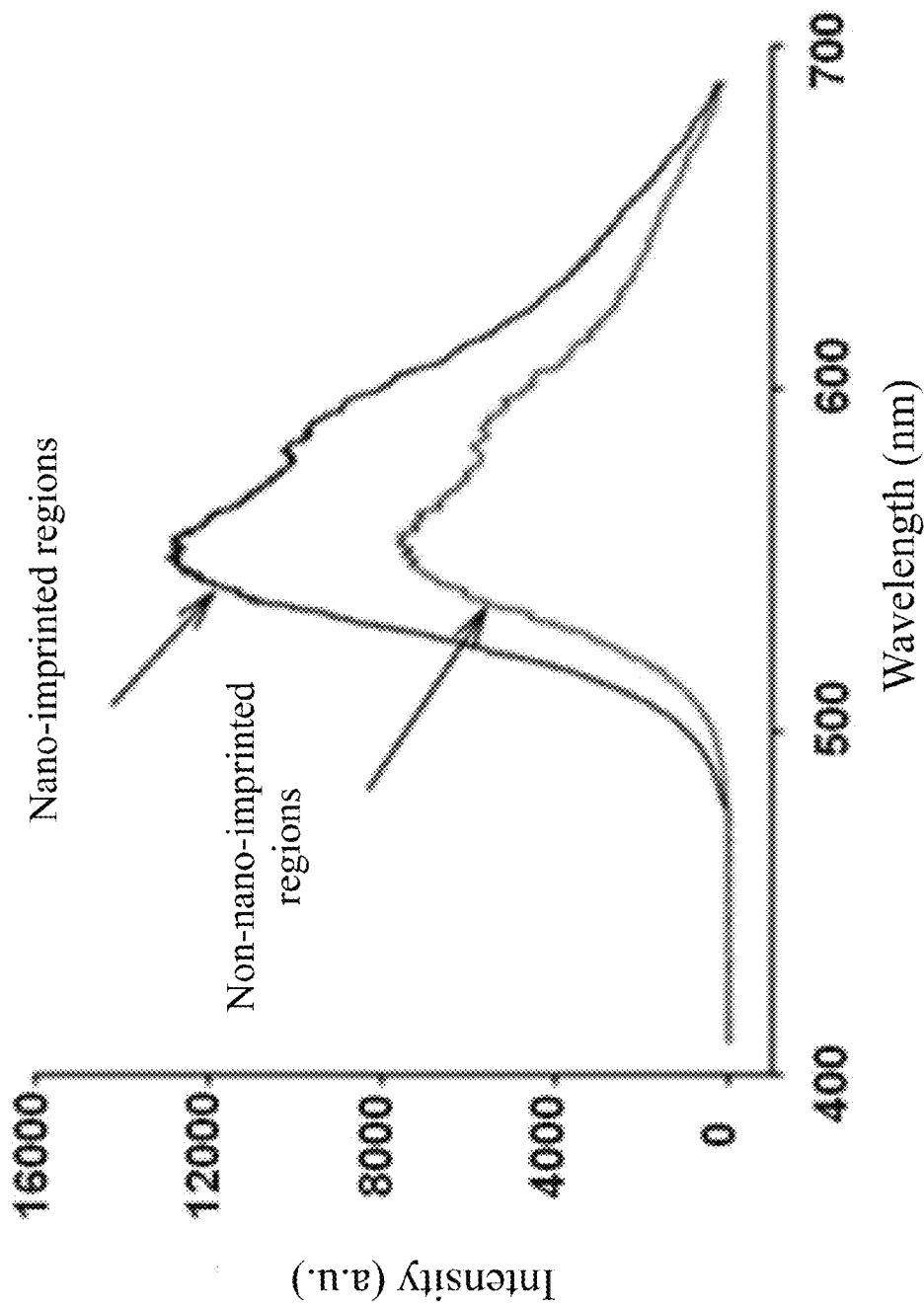
FIG. 8 illustrates a photo-luminescence spectrum image of the nano-imprinted and non-nano-imprinted conjugated polymer thin film in accordance with one embodiment of the present invention.

The surface microstructures of the finally obtained nano-imprinted conjugated polymer thin film may be observed by employing the atomic force microscope (AFM) and the optical microscope (OM), and the luminescent properties of the finally obtained nano-imprinted conjugated polymer thin film may be measured by utilizing the confocal photo-luminescence microscope. In one embodiment, FIG. 7 is an AFM image of the nano-imprinted conjugated polymer thin film. As shown in FIG. 7, the downwards flat-pressed portions are the nano-imprinted regions. FIG. 8 is a confocal photo-luminescence microscope spectrum image of the nano-imprinted and non-nano-imprinted conjugated polymer thin film. As shown in FIG. 8, the PL intensity of the nano-imprinted regions is about 1.8 times as large as the one of the non-nano-imprinted regions, and the spectral shapes of both do not differ, thereby the light colors of the photo-luminescence of both do not necessarily vary. Therefore, the present invention performs the nano-imprinting process to the conjugated polymers to enhance the luminescent intensity of the conjugated polymers up to about twice the original intensity.

Accordingly, as mentioned above, the method for enhancing the optoelectronic properties of the conjugated polymers disclosed by the present invention can improve the optoelectronic properties of the concentrated (high concentration) conjugated polymer thin film effectively and increase the PL intensity of the conjugated polymer thin film up to more than twice the original intensity, but the light colors thereof do not necessarily vary. Therefore, the present invention may be widely applied to the manufacturing processes of organic light emitting diodes (OLED), polymer light emitting diodes (PLED) and solar panels.

The foregoing description is a preferred embodiment of the present invention. It should be appreciated that this embodiment is described for purposes of illustration only, not for limiting, and that numerous alterations and modifications may be practiced by those skilled in the art without departing from the spirit and scope of the invention. It is intended that all such modifications and alterations are included insofar as they come within the scope of the invention as claimed or the equivalents thereof.

What is claimed is:

1. A method for enhancing optoelectronic properties of conjugated polymers, comprising:
preparing at least one conjugated polymer layer, wherein said conjugated polymer layer is conjugated polymer thin film, wherein preparing said at least one conjugated polymer thin film comprises preparing at least one type of molecule which contains a conjugated functional group as a monomer, and activating said monomer in a plasma or evaporation plating said monomer and polymerizing said monomer to form said at least one conjugated polymer thin film; and
axially-stretching said at least one conjugated polymer layer to generate local deformation regions where conjugated polymer chains of said at least one conjugated polymer layer are deformed and stretched to enhance optoelectronic properties of said at least one conjugated polymer layer due to the suppression of electron-phonon interactions.

2. A method for enhancing optoelectronic properties of conjugated polymers, comprising:
preparing at least one conjugated polymer layer, wherein said conjugated polymer layer is conjugated polymer thin film, wherein the step of preparing said at least one conjugated polymer thin film comprises mixing at least one type of molecule which contains a conjugated functional group with one or more types of substances to form a composite monomer, and activating said composite monomer in a plasma or evaporation plating said composite monomer and polymerizing said composite monomer to form said at least one conjugated polymer thin film; and
axially-stretching said at least one conjugated polymer layer to generate local deformation regions where conjugated polymer chains of said at least one conjugated polymer layer are deformed and stretched to enhance optoelectronic properties of said at least one conjugated polymer layer due to the suppression of electron-phonon interactions.

3. The method of claim 2, wherein said one or more types of substances comprise one of small molecules, polymers, carbon spheres, carbon tubes and metal particles, or the combination thereof.

4. The method of claim 2, wherein the step of axially-stretching said at least one conjugated polymer layer to generate local deformation regions comprises performing an imprinting procedure to said conjugated polymer layer through one or more molds.

5. The method of claim 4, wherein said molds comprise nano molds, and said imprinting procedure comprises a nano-imprinting procedure.

6. The method of claim 1, wherein the step of axially-stretching said at least one conjugated polymer layer to generate local deformation regions comprises performing an imprinting procedure to said conjugated polymer layer through one or more molds.

7. The method of claim 6, wherein said molds comprise nano molds, and said imprinting procedure comprises a nano-imprinting procedure.

8. A method for enhancing optoelectronic properties of conjugated polymers, comprising:
preparing at least one conjugated polymer layer, wherein said at least one conjugated polymer layer is conjugated polymer thin film, wherein the step of preparing said at least one conjugated polymer layer includes preparing a conjugated polymer solution and forming said at least one conjugated polymer thin film from said conjugated polymer solution via a procedure, wherein the step of preparing said conjugated polymer solution includes preparing at least one type of conjugated polymer and dissolving said at least one type of conjugated polymer in a solvent to form said conjugated polymer solution; and
axially-stretching said at least one conjugated polymer layer to generate local deformation regions where conjugated polymer chains of said at least one conjugated polymer layer are deformed and stretched to enhance optoelectronic properties of said at least one conjugated polymer layer due to the suppression of electron-phonon interactions.

9. The method of claim 8, wherein said procedure comprises a spin coating procedure or a hot pressing procedure.

10. The method of claim 8, wherein the step of axially-stretching said at least one conjugated polymer layer to generate local deformation regions comprises performing an imprinting procedure to said at least one conjugated polymer layer through one or more molds.

* * * * *